United States Patent
Fan et al.

(10) Patent No.: US 8,680,625 B2
(45) Date of Patent: Mar. 25, 2014

(54) FACET-FREE SEMICONDUCTOR DEVICE

(75) Inventors: Wei-Han Fan, Hsin-Chu (TW); Yu-Hsien Lin, Hsinchu (TW); Yimin Huang, Hsin-Chu (TW); Ming-Huan Tsai, Zhubei (TW); Hsueh-Chang Sung, Zhubei (TW); Chun-Fai Cheng, Hong Kong (CN)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 198 days.

(21) Appl. No.: 12/905,579

(22) Filed: Oct. 15, 2010

(65) Prior Publication Data

US 2012/0091539 A1    Apr. 19, 2012

(51) Int. Cl.
*H01L 27/088* (2006.01)

(52) U.S. Cl.
USPC .......................................................... 257/401

(58) Field of Classification Search
USPC ................... 438/218–233, 424–458; 257/401
See application file for complete search history.

(56) References Cited

U.S. PATENT DOCUMENTS

| | | | |
|---|---|---|---|
| 5,792,703 A * | 8/1998 | Bronner et al. ............... | 438/620 |
| 6,465,870 B2 | 10/2002 | Voldman | |
| 6,906,374 B2 * | 6/2005 | Tanaka .......................... | 257/306 |
| 2001/0049183 A1 * | 12/2001 | Henson et al. ................ | 438/479 |
| 2005/0035397 A1 * | 2/2005 | Otoi et al. ..................... | 257/316 |
| 2006/0286756 A1 * | 12/2006 | Chen ............................. | 438/299 |
| 2007/0122952 A1 * | 5/2007 | Kim .............................. | 438/183 |
| 2007/0281429 A1 * | 12/2007 | Sato .............................. | 438/294 |
| 2009/0166755 A1 * | 7/2009 | Chakravarthi et al. ........ | 257/390 |
| 2009/0184341 A1 | 7/2009 | Chong et al. | |
| 2009/0224328 A1 * | 9/2009 | Ting et al. ..................... | 257/368 |
| 2010/0052065 A1 | 3/2010 | Diaz et al. | |

OTHER PUBLICATIONS

Hsien-Hsin Lin, Tsz-Mei Kwok and Chien-Chang Su; "Method for Fabricating a FINFET Device;" Feb. 10, 2010; U.S. Appl. No. 12/703,570; 40 pages.

* cited by examiner

*Primary Examiner* — Fernando L Toledo
*Assistant Examiner* — Karen Kusumakar
(74) *Attorney, Agent, or Firm* — Haynes and Boone, LLP

(57) ABSTRACT

An exemplary semiconductor device is described, which includes a semiconductor substrate having an active region and an isolation region. The active region has a first edge which interfaces with the isolation region. A gate structure formed on the semiconductor substrate. A spacer element abuts the gate structure and overlies the first edge. In an embodiment, the isolation region is an STI structure. An epitaxy region may be formed adjacent the spacer. In embodiments, this epitaxy region is facet-free.

20 Claims, 4 Drawing Sheets

US 8,680,625 B2

FACET-FREE SEMICONDUCTOR DEVICE

BACKGROUND

The semiconductor industry has progressed into smaller technology node processes in pursuit of higher device density, higher performance, and lower costs. One process for improved device performance includes creating an epitaxy region for the source/drain for enhanced transistor device performance. The epitaxy region provides a strained region that enhances carrier mobility.

Typically isolation regions such as shallow trench isolation (STI) features are used to separate adjacent n-type and p-type transistors. However, the STI feature may cause the epitaxially grown material to form a facet at or near the STI edge (or sidewall). These unwanted facets can impact subsequent processing including, for example, the formation of a contact. For example, silicide, which is typical of contact formation, may be improperly formed on the epitaxy region. Such problems may lead to device performance issues including increases in leakage currents.

Therefore, what is needed is a device and method providing for reduced and/or eliminated facet-formation.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature (or "abutting" a second feature) in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Figure 1:
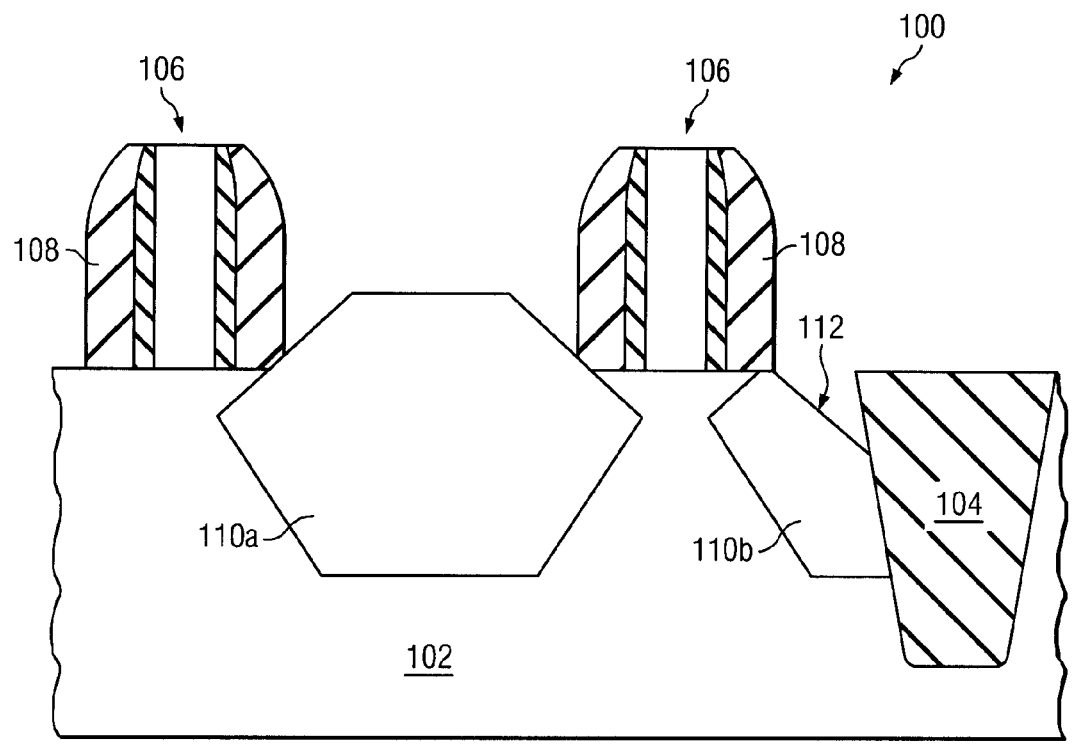
FIG. 1 is a cross-sectional view of an embodiment of a semiconductor device including a facet.

Illustrated in FIG. 1 is an exemplary semiconductor device having a facet. The device 100 includes a semiconductor substrate 102, a shallow trench isolation (STI) structure 104, gate structures 106 having a plurality of spacer elements 108 abutting the gate structures 106, and source/drain regions 110a and 110b. The source/drain region 110b includes a facet 112. The facet 112 may be disadvantageous in that it can create difficulties in providing a contact to the source/drain region 110b. This becomes a greater challenge as dimensions such as the active to active region edge spacing decreases. Device level performance may also be affected including leakage (PMOS Idsat) levels and variation thereof. The facet 112 may be formed because of interaction between the epitaxial process and the STI structure 104.

The present disclosure provides devices and methods which reduce and/or eliminate facets of a semiconductor device such as facet 112 of the device 100. In doing so, one or more of the embodiments described herein may improve the contact landing on an epitaxy region of a semiconductor device. This may provide advantages such as, reduction of facet induced yield loss, improved device (e.g., PMOS) performance, reduced device to device variation in structure and/or performance, improved device (e.g., PMOS) saturation current (IDU) performance and/or variation, and/or other possible advantages.

Specifically, the present disclosure provides embodiments of devices, layouts, systems, and/or methods that allow for reduction and/or elimination of facets through placement of a spacer element on an edge of an active (OD) area. The edge may be defined by an interface with an isolation region. One or more of these embodiments of devices, layouts, systems, and/or methods also allow for reduction of facets through placement of a spacer element on an edge of an isolation region (e.g., STI). The edge of the isolation region may be defined by an interface with an active region. The spacer element overlying the edge of the active region may abut a dummy (e.g., not operational) gate.

Advantages of one or more of the embodiments described herein allow for use of existing processes and/or devices or portions thereof, to reduce and/or eliminate the formation of facets in epitaxy regions of a substrate. Certain embodiments provided herein achieve one or more of these objections without an increase in chip area. Certain embodiments provided herein achieve one or more of these objections without an increase to the process complexity and/or cost.

Figure 2:
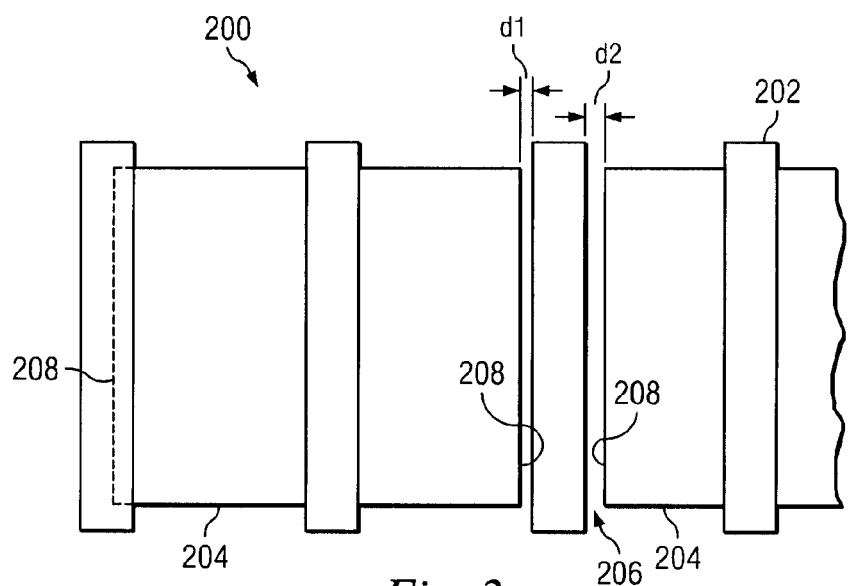
FIG. 2 is top view of an embodiment of a layout of a semiconductor device according to one or more aspects of the present disclosure.
Figure 8:
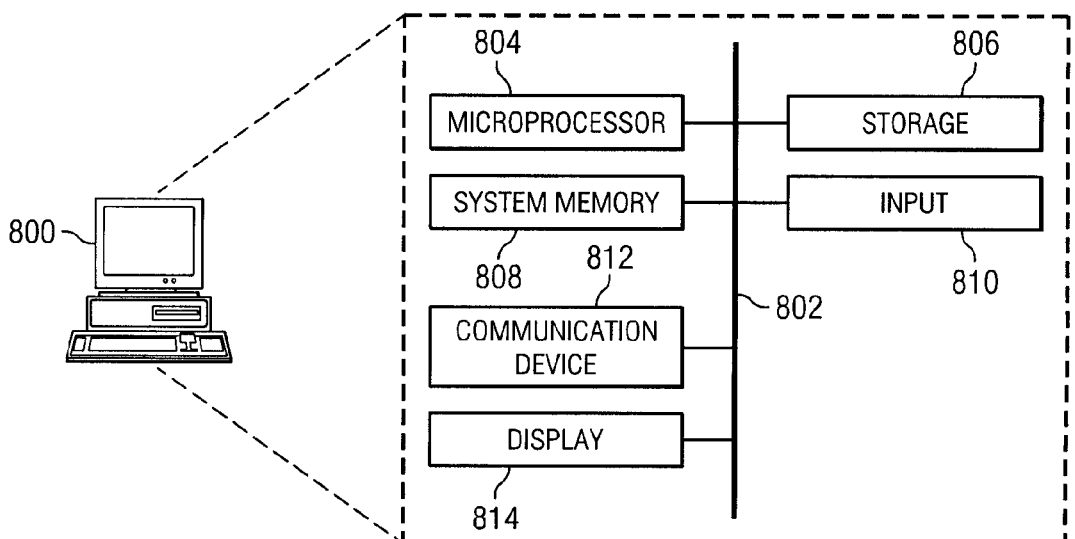
FIG. 8 illustrates a block diagram of an informational handling system that may be used to implement one or more aspects of the present disclosure.

Referring now to FIG. 2, illustrated is a top view of a layout 200 of semiconductor device, which includes active regions 204 and isolation region 206. A plurality of gate structures 202 overlies the regions 204 and 206. The layout 200 illustrates that one of the gate structures 202, which may include dummy (e.g., non-operational) or functional gates, is on or closely adjacent each edge 208 of the active regions 204. In an embodiment where a gate is spaced a distance from the edge 208, such as distance d1 and/or d2, the distance d1 and d2 is such that a spacer element abutting the gate structure 202 overlies the edge 208. In an embodiment, the placement of the gate structures 202 in relation to the edge 208 is determined using the informational handing system (IHS) 800, described below with reference to FIG. 8. The placement is provided such that overlying the active area (or isolation area) edge is achieved taking into account the tolerances of the process, considering the critical dimension (CD) and overlay (OVL) tolerances (e.g., mask alignment).

Thus, the layout 200 provides an exemplary embodiment of a spacer element formed over the edge 208 of the active regions 204. As such, the layout 200 may provide for decreased facet and/or facet-free formation of epitaxial regions grown in the active regions 204 adjacent the isolation regions 206. Though illustrated herein as one gate (or abutting spacer elements) covering both edges of adjacent active regions 204 (or both edges of an isolation region 206), any configuration is possible including where one or more gates (and the associated one or more spacers) cover the edge(s) of an active region 204.

Figure 3:
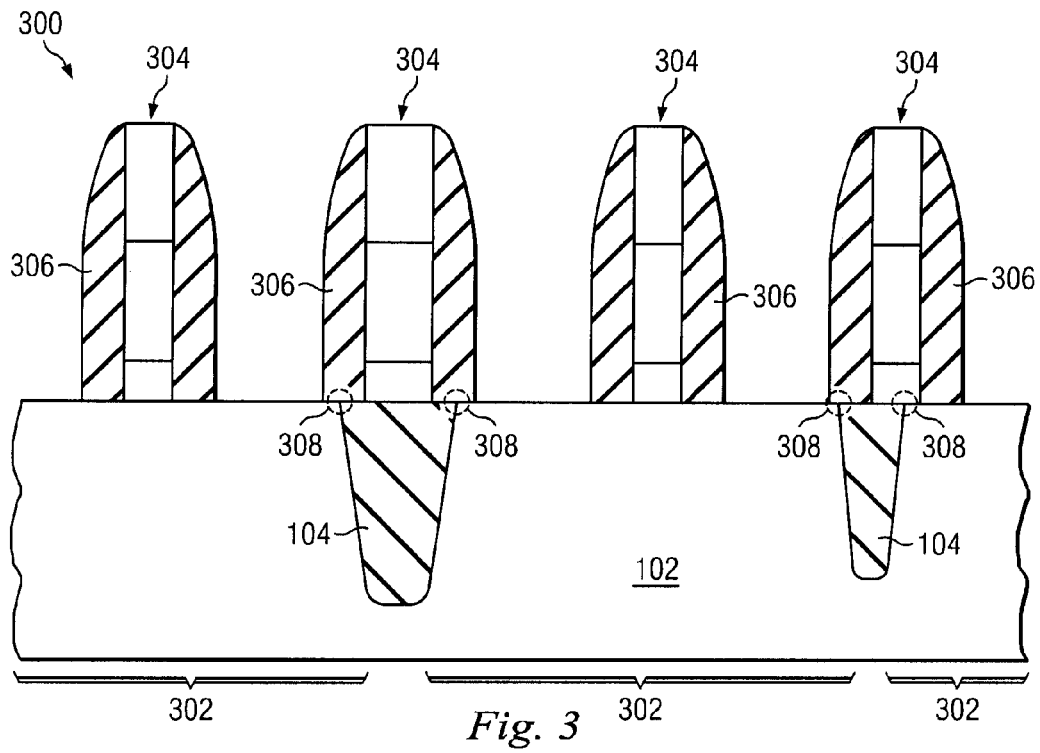
FIG. 3 is a cross-sectional view of an embodiment of a semiconductor device according to one or more aspects of the present disclosure.

Referring now to FIG. 3, illustrated is a device 300, which may also provide one or more of the above described benefits. The device 300 may be facet-free. The device 300 includes a substrate 102, isolation regions 104, and active regions 302. A plurality of gate structures 304 is disposed on the substrate 102. Spacer elements 306 abut each of the gate elements 304.

The substrate 102 is a semiconductor substrate. In an embodiment, the substrate 102 is silicon in a crystalline structure. Other exemplary materials include other elementary semiconductors such as germanium, or compound semiconductors such as, silicon carbide, gallium arsenide, indium arsenide, and indium phosphide. The substrate 102 may be a silicon-on-insulator (SOI) substrate.

The isolation regions 104 include shallow trench isolation (STI) structures. The STI structures may be formed by etching apertures in the substrate 102 using processes such as reactive ion etch (RIE) after photolithography patterning, and/or other suitable processes. The apertures may then be filled with an insulator material, such as an oxide. In an embodiment, the process includes conformal low-pressure chemical vapor deposition (LPCVD) of oxide to fill an aperture, and continues with a chemical mechanical polish (CMP) process to planarize the oxide. Other suitable processes may be used in addition and/or in lieu of those described. In other embodiments, other isolation structures, (e.g., LOCOS, field oxidation), may be used in addition to or in lieu of STI structures.

The active regions 302 interpose the isolation features 104. The active regions 302 may include the portions of the substrate 102 where an active (also referred to herein as functional or operational) device (e.g., PMOS or NMOS) is formed. For example, a gate of a PMOS or NMOS device would overlie the active region 302 of the substrate 102. Thus, a channel and source/drain regions of a functional device are formed in the active region 302.

Edges of the isolation regions 104 and/or edges of the active region 302 are identified by region 308. The edge of the isolation region 104 may be defined by an interface with the active region 302. The edge of the active region 302 may be defined by an interface with the isolation region 104. The region 308 may define the edge of the isolation region 104 and/or the edge of the active region 302 (e.g., the interface there between) at a plane co-planar with the top surface of the substrate 102.

The gate structures 304 include gate structures that are, or will be formed into, gates of active (operational) devices (e.g., NMOS or PMOS devices), as well as dummy gates. Dummy gates structures may be arranged to account for loading effects and/or other issues. The dummy gate structures may be substantially similar to the gate structures of operational devices in terms of formation, composition and/or structure. In an embodiment, the dummy gate structures and operational gate structures are formed in a single process (e.g., a layer of a dummy gate structure is formed with a corresponding layer of an operational gate structure). The gate structures 304 may be dummy gates (e.g., sacrificial polysilicon gates) used in a gate replacement (also known as "gate-last") process of forming metal gate structures for operational devices. In other embodiments, the dummy gate structures remain non-operational in the final device. The gate structures 304 include one or more layers such as, for example, gate dielectric, gate electrodes, capping layers, work function layers, hard mask layers, and/or other suitable layers. One or more of the layers may be sacrificial (e.g., as provided in a gate replacement process). The gate dielectric layer may include a dielectric material such as, silicon oxide, silicon nitride, silicon oxynitride, dielectric with a high dielectric constant (high k), and/or combinations thereof. Examples of high k materials include hafnium silicate, hafnium oxide, zirconium oxide, aluminum oxide, hafnium dioxide-alumina ($HfO_2$—$Al_2O_3$) alloy, or combinations thereof. The gate dielectric layer may be formed using conventional processes such as, photolithography, oxidation, deposition, etching, and/or a variety of other processes known in the art. In an embodiment, the gate structure 304 includes a gate electrode layer of conductive material. In an embodiment, the gate electrode includes polysilicon. In other embodiments, the gate may be a metal gate with the gate electrode including a metal composition. Examples of suitable metals for forming the gate electrode include Cu, W, Ti, Ta, TiN, TaN, NiSi, CoSi, and/or combinations thereof. A gate electrode layer may be formed by suitable methods such as, physical vapor deposition (PVD) (sputtering), chemical vapor deposition (CVD), plasma-enhanced chemical vapor deposition (PECVD), atmospheric pressure chemical vapor deposition (APCVD), low-pressure CVD (LPCVD), high density plasma CVD (HDPCVD), atomic layer CVD (ALCVD), and/or other processes known in the art followed by a photolithography and etching processes. The gate structure 304 may further comprise a contact layer disposed over the gate electrode to reduce contact resistance and improve performance. The contact layer may include metal silicide.

Each gate structure 304 has spacer elements 306 associated with it. The spacer elements 306 may comprise silicon nitride, silicon oxide, silicon carbide, silicon oxynitride, combinations thereof, and/or other suitable materials. The spacer elements 306 may have multilayer structure. The spacer elements 306 formed by depositing dielectric material and then etching back the material. The spacer elements 306 may include a plurality of layers including those layers defining a wall for the gate structures 304 (e.g., in a replacement gate process), offset spacers, spacers that define a low-dosed region, liners, spacers that define a raised/source drain (e.g., epitaxy) region, and other suitable functions. Each and any of these spacer layers, alone or in combination, may be described herein as abutting the gate structure 304 (e.g., adjacent the sidewall of the gate structure 304). The spacer material may be deposited using chemical vapor deposition (e.g., LPCVD), and/or other suitable processes, followed by an etching process (e.g., isotropic etching) to form a spacer. The spacers 306 may be a D-shaped spacer as shown, though other configurations are possible.

The device 300 illustrates one of the spacer elements 306 overlie region 308 (e.g., edge(s) of active region 302). The device 300 also illustrates an embodiment where a dummy gate 304 overlies an edge region 308 and a spacer element 306 overlies another edge region 308. The gate 304 overlying the STI structures 104 may be a dummy gate (i.e., non-operational gate stack). In other embodiments, spacer elements 306 associated with different gate structures 304 may cover each region 308 of a single isolation region 104 (e.g., the interface of an active region and an isolation region). The device 300 may be an embodiment corresponding to the layout 200, described above with reference to FIG. 2.

Figure 4:
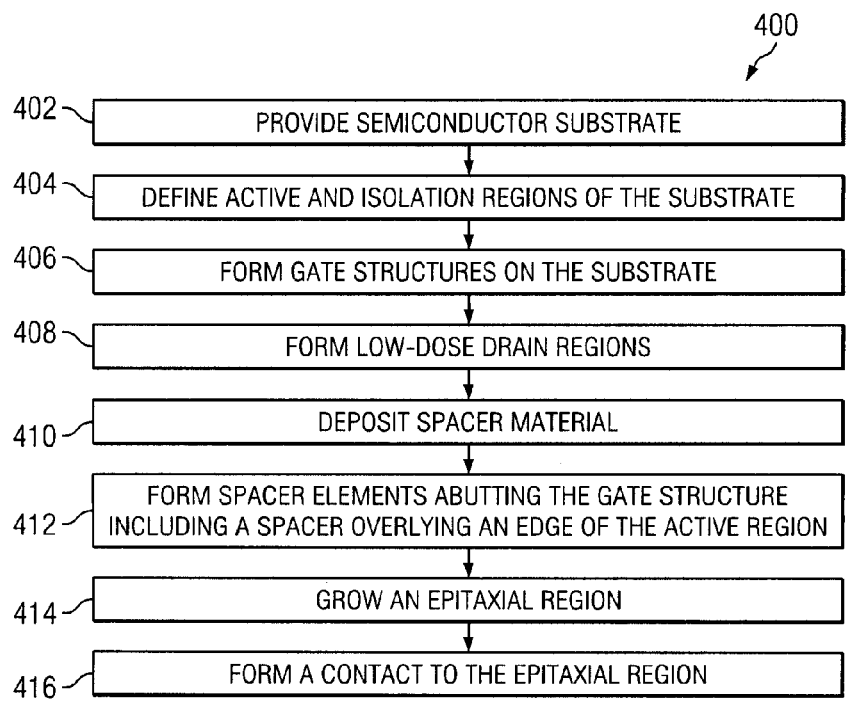
FIG. 4 is a flowchart of an embodiment of a method of fabricating a semiconductor device according to one or more aspects of the present disclosure.

Referring now to FIG. 4, illustrated is a method 400 of fabricating a semiconductor device. The method 400 may be used to form a device associated with the layout 200, described above with reference to FIG. 2, and/or the device 300, described above with reference to FIG. 3. The method 400 begins at block 402 where a semiconductor substrate is provided. The semiconductor substrate may be substantially similar to the substrate 102, described above with reference to FIG. 3.

The method 400 then proceeds to block 404 where active and isolation regions of the substrate are defined. The active and isolation regions may be defined by forming a plurality of isolation structures in the substrate. The active and isolation regions may be substantially similar to the regions 302 and 104, respectively, described above with reference to FIG. 3. In an embodiment, the isolation regions are shallow trench isolation structures. The forming of the active region may include introducing suitable dopants into the substrate by ion implantation, diffusion and/or other suitable processes.

The method 400 then proceeds to block 406 where a plurality of gate structures is formed on the substrate. One or more gate structures overlie the active region and form operational devices in the resulting device. One or more gate structures overlie the isolation region. The gate structures overlying the isolation region may be dummy (i.e., non-functional) gates that do not provide a gate of an active (operational) device (e.g., PMOS or NMOS device). The gate structures may be substantially similar to the gate structures 304, described above with reference to FIG. 3, and/or the gate structures 202, described above with reference to FIG. 2. The gate structures may include sacrificial layers thereof formed in a metal gate process (e.g., a gate replacement or gate-last process).

The gate structures include one or more layers such as, for example, gate dielectric, gate electrodes, capping layers, work function layers, hard mask layers, and/or other suitable layers. The gate dielectric layer may include a dielectric material such as, silicon oxide, silicon nitride, silicon oxynitride, dielectric with a high dielectric constant (high k), and/or combinations thereof. Examples of high k materials include hafnium silicate, hafnium oxide, zirconium oxide, aluminum oxide, hafnium dioxide-alumina ($HfO_2$—$Al_2O_3$) alloy, or combinations thereof The gate dielectric layer may be formed using conventional processes such as, photolithography, oxidation, deposition, etching, and/or a variety of other suitable processes. The gate structure may include a gate electrode layer of conductive material. In an embodiment, the gate electrode includes polysilicon. In other embodiments, the gate may be a metal gate with the gate electrode including a metal composition. Examples of suitable metals for forming the gate electrode include Cu, W, Ti, Ta, TiN, TaN, NiSi, CoSi, and/or combinations thereof. A gate electrode layer may be formed by suitable methods such as, physical vapor deposition (PVD) (sputtering), chemical vapor deposition (CVD), plasma-enhanced chemical vapor deposition (PECVD), atmospheric pressure chemical vapor deposition (APCVD), low-pressure CVD (LPCVD), high density plasma CVD (HDPCVD), atomic layer CVD (ALCVD), and/or other processes known in the art followed by a photolithography and etching processes. The metal gate may be formed at block 406, or formed in subsequent processes using a replacement gate process.

The method 400 then proceeds to block 408 where a low-dose drain (LDD) region is formed on the substrate. The LDD region may be formed using ion implantation of a suitable dopant (e.g., n-type or p-type) and/or other suitable CMOS processes.

The method 400 then proceeds to block 410 where a spacer material is deposited on the substrate. The spacer material may be a conformal layer of dielectric material. In an embodiment, the spacer material is silicon nitride. Other exemplary compositions include silicon oxide, silicon carbide, silicon oxynitride, and/or other suitable materials. The spacer material may be deposited using chemical vapor deposition (e.g., LPCVD), and/or other suitable processes.

Figure 5:
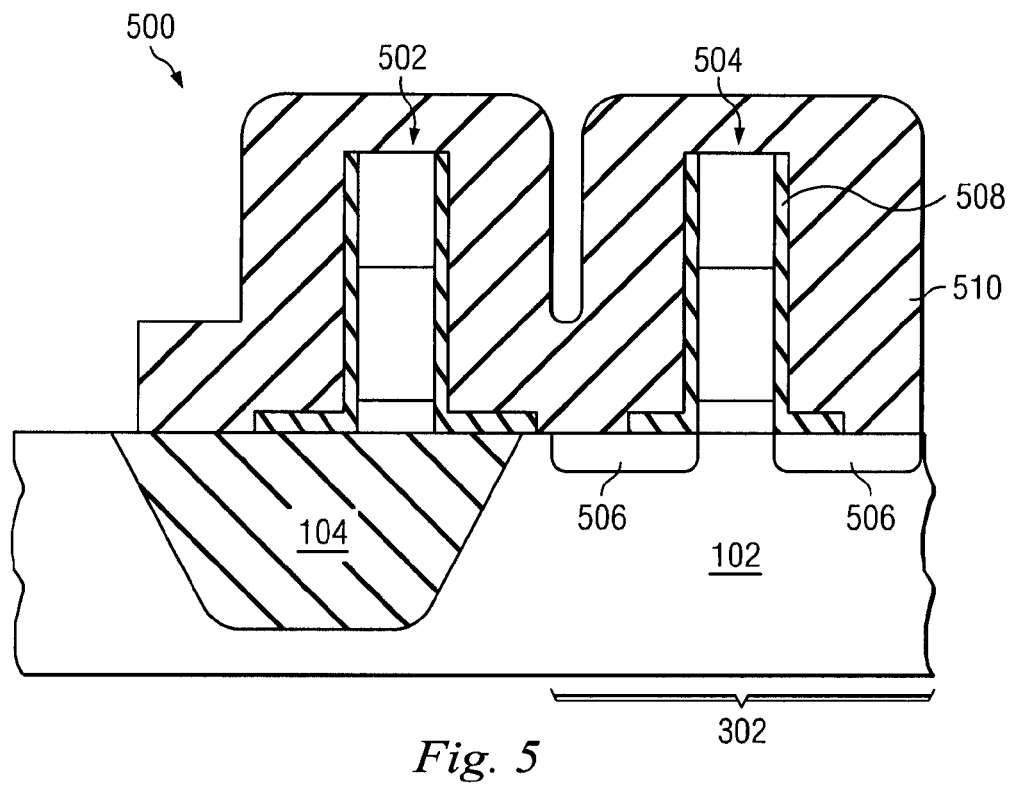
FIGS. 5, 6, and 7 illustrate cross-sectional views of an embodiment of a semiconductor device according to the method of FIG. 4.

Referring now to FIG. 5, a device 500 illustrates an embodiment of a device formed using the method 400 including blocks 402, 404, 406, 408, and 410. The device 500 includes a substrate 102, an isolation region 104, and an active region 302, substantially similar to as described above with reference to FIG. 3. Gate structures 502 and 504 are disposed on the substrate 102 and may be substantially similar to as described above with reference to block 406. The gate structures 502 and/or 504 may be substantially similar to the gate structure 304, described above with reference to FIG. 3. The gate structure 502 illustrates a dummy gate. The gate structure 504 may be a gate structure which is associated with an active (operational) device (e.g., PMOS or NMOS). In an embodiment, the gate structure 504 is a sacrificial gate that may include layer(s) which are later replaced by suitable metal gate materials (e.g., gate dielectric and/or gate electrode). Two LDD regions 506 are illustrated on the device 500. The LDD regions 506 may be substantially similar to as described above with reference to block 408. The LDD regions 506 may be appropriately doped to provide a source/drain extension region for a PMOS or NMOS device that is formed in the active region 302 (e.g., which also includes gate structure 504).

The device 500 also includes spacer elements 508. The spacer elements 508 may include silicon nitride, silicon oxide, silicon carbide, silicon oxynitride, and/or other suitable materials. The spacer elements 508 may provide a liner, define a "wall" for a replacement gate process, and/or provide other functionality.

A spacer material layer 510 is formed on the substrate 102 overlying the gate structures 502 and 504. The spacer material layer 510 may be substantially similar to as described above with reference to block 410 of the method 400. The spacer material 510 may include silicon nitride. Other example materials include silicon oxide, silicon carbide, silicon oxynitride, and/or other suitable materials.

Referring again to FIG. 4, the method 400 proceeds to block 412 where the spacer material is etched to form a plurality of spacers abutting the gate structure. The spacer material is etched such that the resulting spacer overlies an edge of an active region and/or isolation region. The etching may be performed by isotropic or other suitable etching processes suitable for CMOS processing. The etching may be substantially similar to as described above with reference to spacer element 306, described above with reference to FIG. 3.

Figure 6:
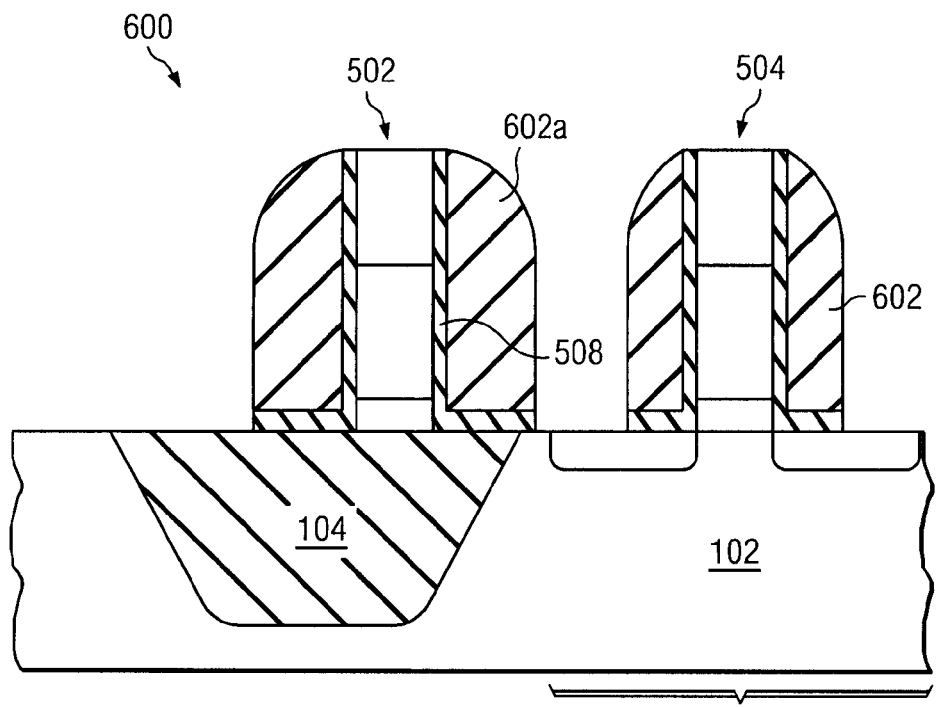

Referring now to FIG. 6, the spacer material 510 is etched to form the spacer elements 602 on a semiconductor device 600. The spacer elements 602 abut the gate structure 502 and 504. The spacer elements 602 may define a source/drain region or portion thereof, including as described below with reference to the raised source/drain region. One of the spacer elements 602, which is identified as 602a, overlies the edge of the active region 302. The spacer element 602a also overlies the edge of the isolation region 104. The semiconductor device 600 may include any number of active and/or isolation regions and a spacer element may overlie any number of the edges of the active/isolation regions. In an embodiment, a gate structure such as gate structure 502 overlies an edge of an active and/or isolation region. In an embodiment, each edge of an active region adjacent an isolation region where an epitaxy region is to be formed adjacent the isolation region is covered (e.g., by spacer elements and/or associated gate structures). The spacer elements 602 may include a plurality of layers including those layers defining a wall for the gate structure 502, offset spacer layers, spacer layers that define a LDD region, liners, spacers that define a source/drain region (e.g., epitaxy region boundary), and the like. The spacer elements 508 (e.g., liner), spacer material 510 and/or spacer elements 602 may be formed concurrently or in one or more separate steps.

Referring again to FIG. 4, the method 400 then proceeds to block 414 where an epitaxy region in grown on the substrate. The epitaxy region may be grown by selective epi growth (SEG). The epitaxy region may include silicon, silicon germanium, silicon carbide, germanium, gallium arsenide, indium phosphide, and/or other suitable materials. The epitaxy region may be adjacent the gate structures and provide a region wherein the source/drain is formed. The epitaxy region may be constrained and/or defined in area by the spacer elements, including those formed in block 412. The epitaxy region may be formed using processes typical of CMOS fabrication process including chemical vapor deposition techniques (e.g., vapor-phase epitaxy (VPE)), molecular beam epitaxy, and/or other suitable processes. The epitaxy process typically uses precursors (gaseous and/or liquid) which interact with the substrate. In an embodiment, the epitaxy region is as-grown or subsequently be doped with an appropriate dopant (e.g., phosphorous).

Figure 7:
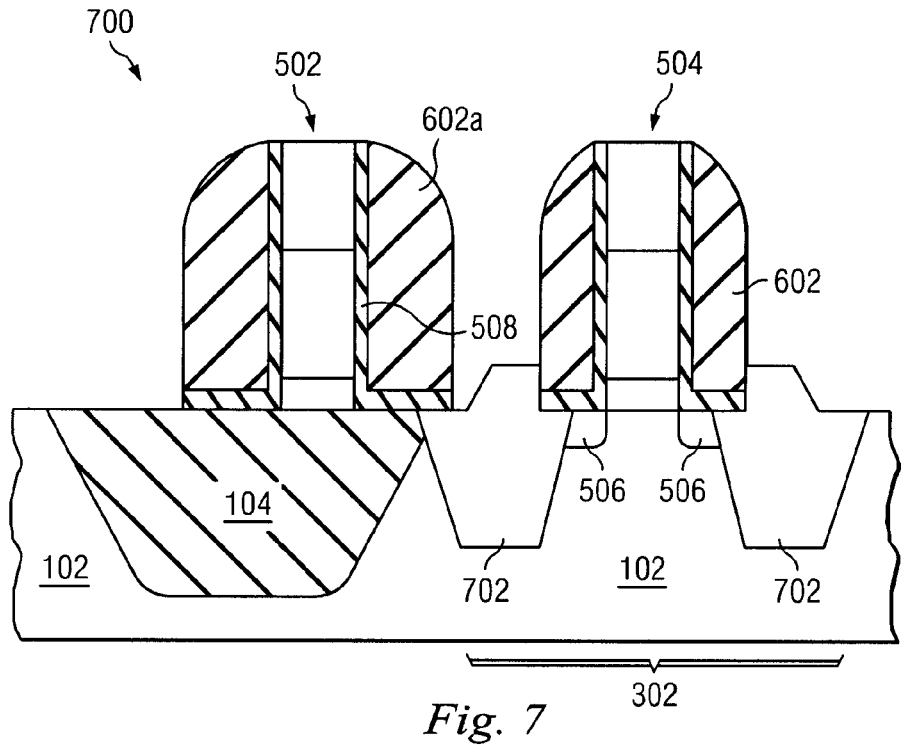

Referring to the example of FIG. 7, illustrated is a device 700 having epitaxy regions 702. The epitaxy regions 702 may provide the source/drain region associated with the gate 504. In an embodiment, the epitaxy regions 702 are silicon germanium. However, other compositions are possible. For example, the epitaxy region may include silicon, silicon carbide, silicon germanium, germanium, gallium arsenide, indium phosphide, and/or other suitable materials. It is noted that the epitaxy regions 702 are facet-free.

Referring again to FIG. 4, the method 400 then proceeds to block 416 where a contact is formed on the epitaxy region. Block 416 may include forming a silicide layer on the raised source/drain epitaxy region to reduce the contact resistance. The silicide may be formed by processes including depositing a metal layer and annealing the metal layer such that it reacts with an underlying silicon-containing material to form silicide, and subsequently removing the non-reacted metal.

It is understood that the method 400 may continue with a CMOS process flow to form various structures and features such as silicide features, contact etch stop layers (CESL), inter-level dielectric (ILD), contact/vias, interconnect layers, metal layers, dielectric layers, passivation layer and so forth. In an embodiment, the gate structures fabricated as described above, including block 406, remain in the final circuit. In other embodiments, the gate structures are partially and/or completely removed and the resulting trench refilled with materials proper for forming a gate of a semiconductor device. Various layers of a multiple layer interconnect (MLI) are formed on the substrate to connect the various features described above.

The semiconductor devices described herein, including devices 300, 500, 600 and 700 serve as illustrative of exemplary devices that may benefit from the present disclosure. The methods and structures described herein have various applications including a hetero-semiconductor device, a memory cell, multi-gate transistors, sensors, logic cells, and/or various other semiconductor devices.

Illustrated is an embodiment of a informational handling system (e.g., computer system) 800 for implementing embodiments of the present disclosure including the methods described herein. In an embodiment, the computer system 800 includes functionality providing for one or more steps of designing a circuit or chip including performing simulations, verification analysis (e.g., DRC, LVS), extraction of parameters, layout, place and route, DFM, and/or other suitable tools and/or procedures.

The computer system 800 includes a microprocessor 804, an input device 810, a storage device 806, a system memory 808, a display 814, and a communication device 812 all interconnected by one or more buses 802. The storage device 806 may be a floppy drive, hard drive, CD-ROM, optical device or any other storage device. In addition, the storage device 806 may be capable of receiving a floppy disk, CD-ROM, DVD-ROM, or any other form of computer-readable medium that may contain computer-executable instructions. The communications device 812 may be a modem, a network card, or any other device to enable the computer system to communicate with other nodes.

The computer system 800 includes hardware capable of executing machine-readable instructions as well as the software for executing acts (typically machine-readable instructions) that produce a desired result. Software includes any machine code stored in any memory medium, such as RAM or ROM, and machine code stored on other storage devices (such as floppy disks, flash memory, or a CD ROM, for example). Software may include source or object code, for example. In additional software encompasses any set of instructions capable of being executed in a client machine or server. Any combination of hardware and software may comprise a computer system. The system memory 808 may be configured to store a design database, library, technology files, design rules, PDKs, models, decks, and/or other information used in the design of a semiconductor device.

Computer readable mediums include passive data storage, such as RAM as well as semi-permanent data storage such as a compact disk read only memory (CD-ROM). In an embodiment of the present disclosure may be embodied in the RAM of a computer to transform a standard computer into a new specific computing machine. Data structures are defined organizations of data that may enable an embodiment of the present disclosure. For example, a data structure may provide an organization of data, or an organization of executable code. Data signals could be carried across transmission mediums and store and transport various data structures, and thus, may be used to transport an embodiment of the present disclosure.

The computer system 800 may be used to implement one or more of the methods and/or devices described herein. In particular, the computer system 800 may be operable to generate, store, manipulate, and/or perform other actions on a layout pattern (e.g., GDSII file) associated with an integrated circuit.

In an embodiment, a method of laying-out an integrated circuit includes implementing a design rule that provides a set field poly to active spacing. The spacing design rule may provide a layout that provides a spacer element overlying an edge of one or more active regions of the device. In an embodiment, a design rule is provided such that a spacer element (and/or an associated gate structure) overlies each and every edge of an active region adjacent to which a raised source/drain (e.g., epitaxial region) is formed. The edge of the active region may be defined by an interface with an isolation region (e.g., STI). The design rule may be a fixed rule number for all devices (e.g., NMOS and PMOS). Thus, a layout is provided that may reduce and/or eliminate facet-formation in epitaxial regions grown adjacent to isolation features.

In an embodiment, one or more of the layouts described above may be generated, manipulated, and/or stored using the computer system 800. The patterns provided by the computer system 800 may be in a typical layout design file format which is communicated to one or more other computer systems for use in fabricating photomasks including the defined patterns.

It is understood that different embodiments disclosed herein offer different disclosure, and that they may make various changes, substitutions and alterations herein without departing from the spirit and scope of the present disclosure.

Thus, an embodiment of a semiconductor device. The semiconductor device includes a semiconductor substrate having an active region and an isolation region (e.g., STI). The active region has a first edge which interfaces with the isolation region. A gate structure formed on the semiconductor substrate and a spacer element is formed abutting the gate structure. The spacer element overlies the first edge. The first edge may be co-planar with a top surface of the semiconductor substrate.

In an exemplary embodiment, the spacer element includes silicon nitride. In an exemplary embodiment, the gate structure is a dummy gate. A second gate structure adjacent and spaced a distance from the dummy gate, wherein an epitaxy region interposes the dummy gate and the second gate structure. In embodiments, the device may further include a raised source/drain region adjacent the spacer element.

Another exemplary device is described which includes a semiconductor substrate having a top surface and a shallow trench isolation (STI) structure disposed in the substrate and having a top surface co-planar with the top surface of the semiconductor substrate. The STI structure has top surface with a first end and a second end. A first spacer element overlies the first end of the STI structure.

In embodiments, the device further includes a gate structure abutting the first spacer element and/or a second spacer element interposing the first spacer element and the gate structure. An epitaxy region (epi) may be adjacent the first spacer element. The epi region is at least one of silicon and SiGe. The epi region may include a raised source or a raised drain. The raised source or the raised drain may be associated with a first gate structure, and the first spacer element abuts a second gate structure. The second gate structure may overlie the STI structure. In an embodiment, the second gate structure is a dummy (e.g., not operational) gate.

A method of fabricating a semiconductor device is also described. The method includes providing a substrate and forming a shallow trench isolation (STI) feature in the substrate. The STI structure defines an active region adjacent the STI feature. The method also includes forming a gate structure on the substrate and depositing a spacer material on the gate structure. The spacer material is etched to form a first spacer element abutting the gate structure, wherein the first spacer element overlies an interface between the STI feature and the active region.

In one example, the method further includes forming a low dose drain (LDD) region prior to depositing the spacer material. The method may also include growing an epitaxy region adjacent the first spacer element. The growing the epitaxy region may includes forming a facet-free region. In some example, the gate structure is removed to provide a cavity and a metal gate electrode is formed in the cavity.

What is claimed is:

1. A semiconductor device, comprising:
a semiconductor substrate having an active region and an isolation region, wherein the active region has a first edge which interfaces with the isolation region;
a gate structure formed on the semiconductor substrate, the gate structure directly overlying the isolation region, wherein the gate structure includes a first sidewall and an opposing second sidewall;
a first spacer element abutting the first sidewall of the gate structure and directly overlying the first edge; and
a second spacer element abutting the second sidewall of the gate structure and extending laterally over the isolation region away from the gate structure, wherein the second spacer element includes an outermost edge that is positioned further away from the gate structure than any other edge of the second spacer element, wherein the isolation region extends within the semiconductor substrate from the first edge that is directly below the first spacer element to beyond the outermost edge of the second spacer element, wherein the second spacer element includes a portion physically contacting the isolation region.

2. The semiconductor device of claim 1, wherein the first edge is co-planar with a top surface of the semiconductor substrate.

3. The semiconductor device of claim 1, wherein the first spacer element includes silicon nitride.

4. The semiconductor device of claim 1, wherein the gate structure is a dummy gate.

5. The semiconductor device of claim 4, further comprising a second gate structure adjacent and spaced a distance from the dummy gate, wherein an epitaxy region interposes the dummy gate and the second gate structure.

6. The semiconductor device of claim 1, further comprising:
a raised source/drain region adjacent the first spacer element.

7. The semiconductor device of claim 1, wherein the isolation region is a shallow trench isolation (STI) feature.

8. A device, comprising:
a semiconductor substrate having a top surface and active region;
a shallow trench isolation (STI) structure disposed in the substrate and having a top surface co-planar with the top surface of the semiconductor substrate, wherein the top surface of the STI structure has a first end and a second end;
a first spacer element formed of a material and overlying the first end of the STI structure, wherein the material of the first spacer element directly interfaces with the first end of the STI structure and the active region; and
a second spacer element directly overlying the STI structure and spaced apart from the first spacer element, wherein the second spacer element is formed of the material and the material of the second spacer element directly interfaces with the STI structure, wherein the STI structure continuously extends within the substrate from the first spacer to beyond the second spacer element such that the second spacer element is positioned between the first and second ends of the STI structure.

9. The device of claim 8, further comprising:
a gate structure abutting the first spacer element.

10. The device of claim 9, wherein the second spacer element abuts the gate structure.

11. The device of claim 8, further comprising:
an epitaxy (epi) region adjacent the first spacer element.

12. The device of claim 11, wherein the epi region is at least one of silicon epi and SiGe epi.

13. The device of claim 11, wherein the epi region includes at least one of a raised source and a raised drain.

14. The device of claim 13, wherein at the at least one of the raised source and the raised drain is associated with a first gate structure and the first spacer element abuts a second gate structure.

15. The device of claim 14, wherein the second gate structure overlies the STI structure.

16. A method of fabricating a semiconductor device, the method comprising:
providing a substrate;
forming a shallow trench isolation (STI) feature in the substrate, wherein the STI structure defines an active region adjacent the STI feature;
forming a gate structure on the substrate, the gate structure having first and second opposing sidewall portions;
depositing a spacer material on the gate structure such that the deposited spacer material physically contacts the first and second sidewall portions of the gate structure and the STI feature; and
etching the spacer material to form a first spacer element and a second spacer element, wherein the first spacer element abuts the first sidewall portion of the gate structure, wherein the first spacer element directly overlies an interface between the STI feature and the active region such that a first portion of the first spacer element physically contacts the STI feature and a second portion of the first spacer element physically contacts the active region, wherein the second spacer element abuts the second sidewall portion of the gate structure and extends laterally over the STI feature away from the gate structure, wherein the second spacer element includes an outermost edge that is positioned further away from the gate structure than any other edge of the second spacer element, wherein the STI feature extends within the semiconductor substrate from the interface that is directly below the first spacer element to beyond the outermost edge of the second spacer element.

17. The method of claim 16, further comprising:
growing an epitaxy region adjacent the first spacer element.

18. The method of claim 17, wherein the growing the epitaxy region includes forming a facet-free region.

19. The method of claim 16, further comprising:
removing the gate structure to provide a cavity; and
forming a metal gate electrode in the cavity.

20. The semiconductor device of claim 1, further comprising:
another gate structure adjacent the gate structure;
a third spacer element abutting the another gate structure; and
a raised source/drain feature extending in the substrate from the third spacer element to the first spacer element, wherein a first portion of the raised source/drain feature is disposed directly under the third spacer element and a second portion of the raised source/drain features is disposed directly under the first spacer element.

* * * * *